United States Patent [19]
Sarno et al.

[11] Patent Number: 5,963,736
[45] Date of Patent: Oct. 5, 1999

[54] SOFTWARE RECONFIGURABLE TARGET I/O IN A CIRCUIT EMULATION SYSTEM

[75] Inventors: Tony R. Sarno, Scotts Valley; Ingo Schaefer, Sunnyale; John E. Chilton, Soquel; Mark S. Papamarcos; Curt Blanding, both of San Jose, all of Calif.

[73] Assignee: Quickturn Design Systems, Inc., Mountainview, Calif.

[21] Appl. No.: 08/805,852

[22] Filed: Mar. 3, 1997

[51] Int. Cl.[6] .................................................. G06F 9/455
[52] U.S. Cl. ........................................................ 395/500.48
[58] Field of Search ............................................. 395/500

[56] References Cited

U.S. PATENT DOCUMENTS

| | | | |
|---|---|---|---|
| 5,321,828 | 6/1994 | Phillips et al. | 395/500 |
| 5,721,880 | 2/1998 | McNeill, Jr. et al. | 395/500 |
| 5,743,748 | 4/1998 | Takahata et al. | 439/71 |
| 5,761,484 | 6/1998 | Agarawal et al. | 395/500 |
| 5,774,695 | 6/1998 | Autrey et al. | 395/500 |
| 5,781,759 | 7/1998 | Kashiwabara | 395/500 |

FOREIGN PATENT DOCUMENTS 0 165 517 A2  12/1985  European Pat. Off. .

*Primary Examiner*—Kevin J. Teska
*Assistant Examiner*—Ayni Mohamed
*Attorney, Agent, or Firm*—Lyon & Lyon LLP

[57] ABSTRACT

A time-sliced hardware-based emulator including at least one of: programmable I/O assignment; programmable levels of DC voltage; programmable pull-up or pull-down resistors in the emulator on a pin-by pin basis; programmable forcing and/or disabling of value output from the emulator on each pin; programmable clocking; and programmable sample modes. An emulator is connected to a target system via a Pod System Interface (PSI), a specially designed cable, and a Pod User Interface (PUI). For data traveling from the emulator to the target system, each PSI receives up to 128 bits of data from the emulator. The cable, however, is only 32 bits wide. Therefore, the emulator multiplexes the data sent over the cable, sending eight interleaved groups of 32 bits to the PSI in accordance with a fast clock signal. Each PUI receives the groups of 32 bits from the PSI and sends them to the target system in accordance with control signals from the emulator. For data traveling from the target system to the emulator, each PUI receives up to 128 bits of data from the target system. Each PUI sends four groups of 32 bits in accordance with a fast clock signal. Each PSI receives the groups of 32 bits and holds them in an internal register, sending the received bits to the emulator under control of the emulator.

5 Claims, 22 Drawing Sheets

Microfiche Appendix Included
(2 Microfiche, 72 Pages)

TARGET INTERFACE ATTACHMENTS

| FIG. 6B | FIG. 6C |

FIG. 6A

| PIN ASSIGNMENT FILE | |
|---|---|
| CONNECTOR_ID | DESIGN_IO |
| 0_A1-A7 | CLCK |
| 0_D3_B70 | ADDR[0] |
| 0_A1_A12 | ADDR[1] |
| 0_A1_A8 | DIN [0] |
| 0_A1_A9 | DIN [1] |
| 0_A1_A10 | WEN |
| 0_A1_A18 | REN |
| 0_A1_A13 | DOUT [0] |
| 0_A1_A14 | DOUT [1] |
| 0_A1_A15 | ROUT |
| 0_A1_A16 | ZZ |

File Contents

The Pin Assignment file is a table containing the relationship between connector identifiers and your custom design I/O names.

File Format

When editing the Pin Assignment file, follow these conventions:
- Begin all comment lines with the character: #
- Blank lines can be used
- Each entry of both fields must be on *one* line
- Each line should follow this order: connector_id, user_design_io_name.
- The *lines* of table data can appear in any order

Sample Pin Assignment File Entry

| connector_id | design_io |
|---|---|
| 0_A1_XXX1 | addr |
| 0_A1_XXX2 | reset |

NOTE Pod Pin A7 is designated as the pin to drive your clock. If you have multiple Pods, each Pod (A1, A2, A3, B1, B2, B3... D3) *must* have pin A7 assigned as your clock signal pin.

FIG. 9A

FILE DATA RELATIONSHIPS FOR IN-CURCUIT EMULATION

128 PER POD

5,963,736

SOFTWARE RECONFIGURABLE TARGET I/O IN A CIRCUIT EMULATION SYSTEM

RELATED APPLICATIONS

This application is related to the following applications, which are herein incorporated by reference 1. U.S. application Ser. No. 08/197,430, entitled "Method and Apparatus for a Trace Buffer in an Emulation System," of Kuijsten, filed Feb. 16, 1994and now U.S. Pat. No. 5,680,583;

2. U.S. application Ser. No. 08/242,164, entitled "Emulation System Having Multiple Emulator Clock Cycles Per Emulated Clock Cycle," of Kuijsten, filed May 13, 1994 and now abandoned;

3. U.S. application Ser. No. 08/496,239, entitled "Emulation System Having Multiple Emulated Clock Cycles Per Emulated Clock Cycle and Improved Signal Routing," of Chilton et al., filed Jun. 28, 1995; and 4. U.S. application Ser. No. 08/597,197, entitled "System and Method for Emulating Memory," of Chilton et al., filed Feb, 6, 1996 and now U.S. Pat. No. 5,819,065.

Reference is made to a microfiche appendix A comprising sixteen frames of a high level functional description of a Pod System Interface (PSI) module.

Reference is made to microfiche appendix B comprising sixteen frames of high level functional description of a Pod User Interface (PUI) module.

TABLES

This application contains Tables I and II, which are a part of the instant specification and are incorporated herein by reference.

FIELD OF THE INVENTION

This application relates to simulation of digital circuits via a hardware emulator and, specifically, to a method and apparatus for configuring a hardware emulator to automate and ease the process of connecting the user design in the emulator to the target hardware environment.

BACKGROUND OF THE INVENTION

As electronic circuit designs continue to increase in speed and complexity, it becomes ever more critical to test the developing circuit designs at various stages of development. Hardware emulators provide a means to test complex circuit designs as the designs are being developed. Such emulators typically provide configurable hardware that is controlled by software to perform the functions of a circuit being designed. The circuit design is specified by a set of data that defines the circuit structure and behavior. The emulator is often connected to a "target system," which is the actual circuit with which the circuit design will eventually operate.

Emulators operate under software control. The circuit design is "compiled" to produce the program that controls the emulator. Speed is of the essence in emulators because inevitably the emulator cannot perform the functions of the circuit being emulated as quickly as the actual circuit, itself. It is desirable to operate the emulator at speeds as close as possible to the target operating speed of the emulated circuit for purposes of accurately interfacing the design to external circuits or other devices and to test the circuit for timing problems.

Because an emulator must perform the functionality of a wide range of circuit designs, it should be as flexible as possible. This means the emulation system must contain logic processing hardware that is reusable for different designs. Such an emulation system would contain a large number of general purpose processing elements that are used to indirectly perform the function of the circuit being emulated. For example, a general purpose emulator would process multiple Boolean logic equations to emulate a multiplier circuit rather than use a dedicated hardware multiplier for the same purpose that would then become unusable in the emulation of circuit designs that do not contain any multiplier functions. In order to solve these equations, many gates, or other devices, in the emulator must be provided with signals. Further, the outputs of the gates or other components must be routed efficiently among the various components of the emulator.

Emulators generally are capable of executing at close to real-time speeds. Thus, for example, an emulation of a circuit that attaches to a target system (a bus, for example) can be hooked to the physical bus during testing. Ideally, human designers should have the freedom to design I/O to and from any target interface pin that they desire. This capability should be able to be accomplished without regard for the type of pin being emulated (e.g., input, output, or tristate) and without regard for the pin's location on a physical plug.

Emulation systems are required to support the emulation of designs with large numbers of target interface pins. Each general purpose pin supported in an emulation system required three different signals: input, enable, and output signals. Many target devices have interfaces of 1000 pins or more. This equates to 3000 or more signals, resulting in bulky cables that reduce reliability and make connection to the target system difficult.

In addition, some user designs need to be interfaced to different families of target logic devices. These can include, but are not limited to 3.3 volt and 5 volt logic. A problem with some emulators is that some devices being emulated connect to busses and contain internal resistive devices that take the bus wires to a high or low logic level when all other devices on the bus are in a high impedance state.

Another problem with many emulators occurs when the human designer is debugging a design that may generate activity on the target interface that could damage the target interface or interfere with its correct operation. What is needed is a way to ensure that such damage will not occur.

Yet another problem with many emulators springs from the fact that in some cases it is desirable for the target system to generate clocking for the target hardware. In other cases, it is desirable that the clock signal be an input to the target emulated system. In the early stages of design, the user may want to provide clocking to a static target environment because this mode of operation allows single stepping by the emulator. Later, when the design is more stable, the human designer may want to use the system clock from the target hardware.

In many emulators, the target hardware circuitry provides inputs to the emulated design that come from outputs of registers in the emulator (also called "registered outputs") or that come from the outputs of registers followed by combinational logic. In sampled data systems, such as a time-sliced hardware emulator, it is necessary to treat these inputs differently in order to be able to process the design in only one emulation program cycle, while accurately modeling the design.

SUMMARY OF THE INVENTION

The present invention overcomes the problems and disadvantages of the prior art by implementing several features in a time-sliced hardware-based emulator. These features include programmable I/O assignment; programmable levels of DC voltage; programmable pull-up or pull-down resistors in the emulator on a pin-by pin basis; programmable forcing and/or disabling of value output from the emulator on each pin; programmable clocking; and programmable sample modes.

A preferred embodiment of the present invention incorporates a plurality of Pod System interfaces (PSIs), each of which plugs into a backplane of the emulator. Each PSI is connected via a specially designed cable to a Pod User Interface (PUI). Each PUI is, in turn, connected to an interface of the target system. For data traveling from the emulator to the target system, each PSI receives up to 128 bits of data from the emulator. The cable, however, is only 32 bits wide. Therefore, the emulator multiplexes the data sent over the cable, sending eight groups of 32 bits to the PSI in accordance with a fast clock signal (four interleaved pairs of 32 bit data and enable signals). Each PUI receives the groups of 32 bits from the PSI and sends them to the target system in accordance with control signals from the emulator.

For data traveling from the target system to the emulator, each PUI receives up to 128 bits of data from the target system. Each PUI sends four groups of 32 bits in accordance with a fast clock signal. Each PSI receives the groups of 32 bits and holds them in an internal register, sending the received bits to the emulator under control of the emulator. As described below, the multiplexed data may be organized further to increase transmission and/or processing speed.

Various embodiments of the present invention provide increased efficiency, time savings, or increased data validity. Each of these embodiments is discussed below in turn.

In accordance with the purpose of the invention, as embodied and broadly described herein, the invention is a target I/O system for coupling an emulator having a plurality of data bits to a target system, comprising: a plurality of PSI modules coupled to the emulator, each PSI module sending input bits to the emulator and receiving output bits and output enable bits from the emulator in a predetermined order; a cable coupled to each of the PSI modules; and a plurality of PUI modules, each of the PUI modules connected to a respective one of the PSI modules through a respective cable, and further coupled to the target system to transmit the input, output and output enable bits to and from the target system in the predetermined order.

Advantages of the invention will be set forth in part in the description which follows and in part will be obvious from the description or may be learned by practice of the invention. The objects and advantages of the invention will be realized and attained by means of the elements and combinations particularly pointed out in the appended claims and equivalents.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 6(a) shows the relationship between FIGS. 6(b) and 6(c).

FIG. 9(a) shows an example of a pin assignment file (PAF), which describes each input and output pin of a target system.

DETAILED DESCRIPTION OF THE PREFERRED EMBODIMENTS

Reference will now be made in detail to the preferred embodiments of the invention, examples of which are illustrated in the accompanying drawings. Wherever possible, the same reference numbers will be used throughout the drawings to refer to the same or like parts.

Figure 1:
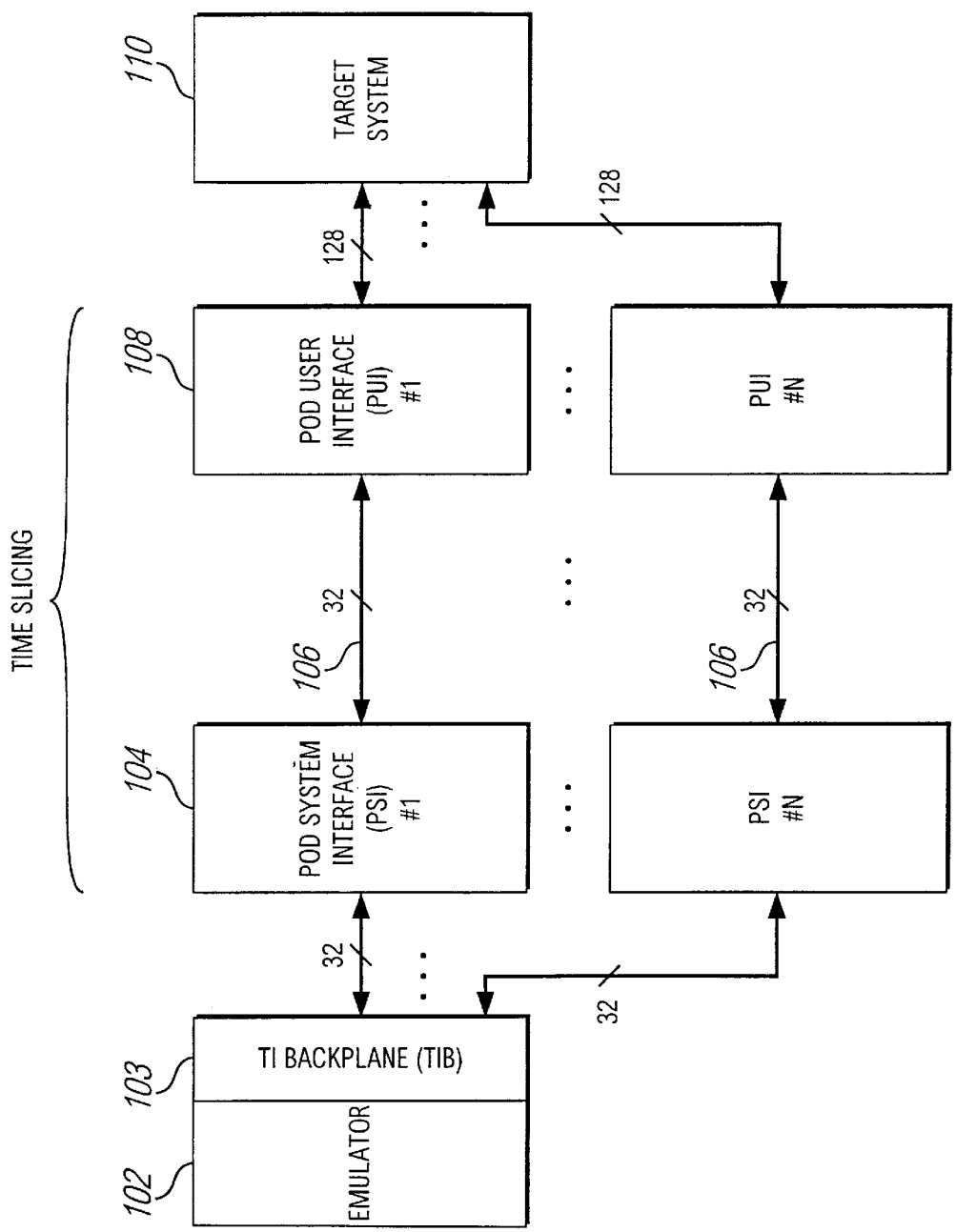
FIG. 1 is a system level block diagram of a preferred embodiment of the present invention.

FIG. 1 is a system level block diagram of a preferred embodiment of the present invention. FIG. 1 includes an emulator 102. Emulator 102 can be, for example, a time-sliced emulator as described in U.S. application Ser. No. 08/496,239 entitled "Emulation System Having Multiple Emulated Clock Cycles Per Emulator Clock Cycle and Improved Signal Routing," of Chilton et al., filed Jun. 28, 1995, which is herein incorporated by reference. Emulator 102 includes a Target Interface Backplane (TIB) 103. TIB 103 includes a plurality of N 32 bit data lines for interfacing to a plurality of PSIs (Pod System Interfaces) 104. TIB 103 and each PSI 104 are also connected by control lines (not shown). In the described embodiment, N=12. Thus, TIB 103 has up to 12×32=384 data I/O lines for interfacing with PSIs 104. In another preferred embodiment, N=11. Thus, TIB 103 has up to 11×32=352 data I/O lines for interfacing with PSIs 104.

Each cable 106 carries 32 data bits (and additional control bits) and connects a PSI and a PUI (Pod User Interface). The system contains a plurality of N PUIs, each of which connects to target system 110 via a 128 bit data bus and control signals (not shown).

a. Time Multiplexing of Target Interface Signals

In the described embodiment, the controller uses time-multiplexing to reduce the number of cables used to support the target system. When the target interface is defined for the emulator system, it is divided into twelve parts, each having 128 pins. 384 signals are required to support 128 pins (i.e., an input, output enable, and output signal for each pin). The emulator time-multiplexes these 384 signals onto 32 physical data wires.

Figure 10A:
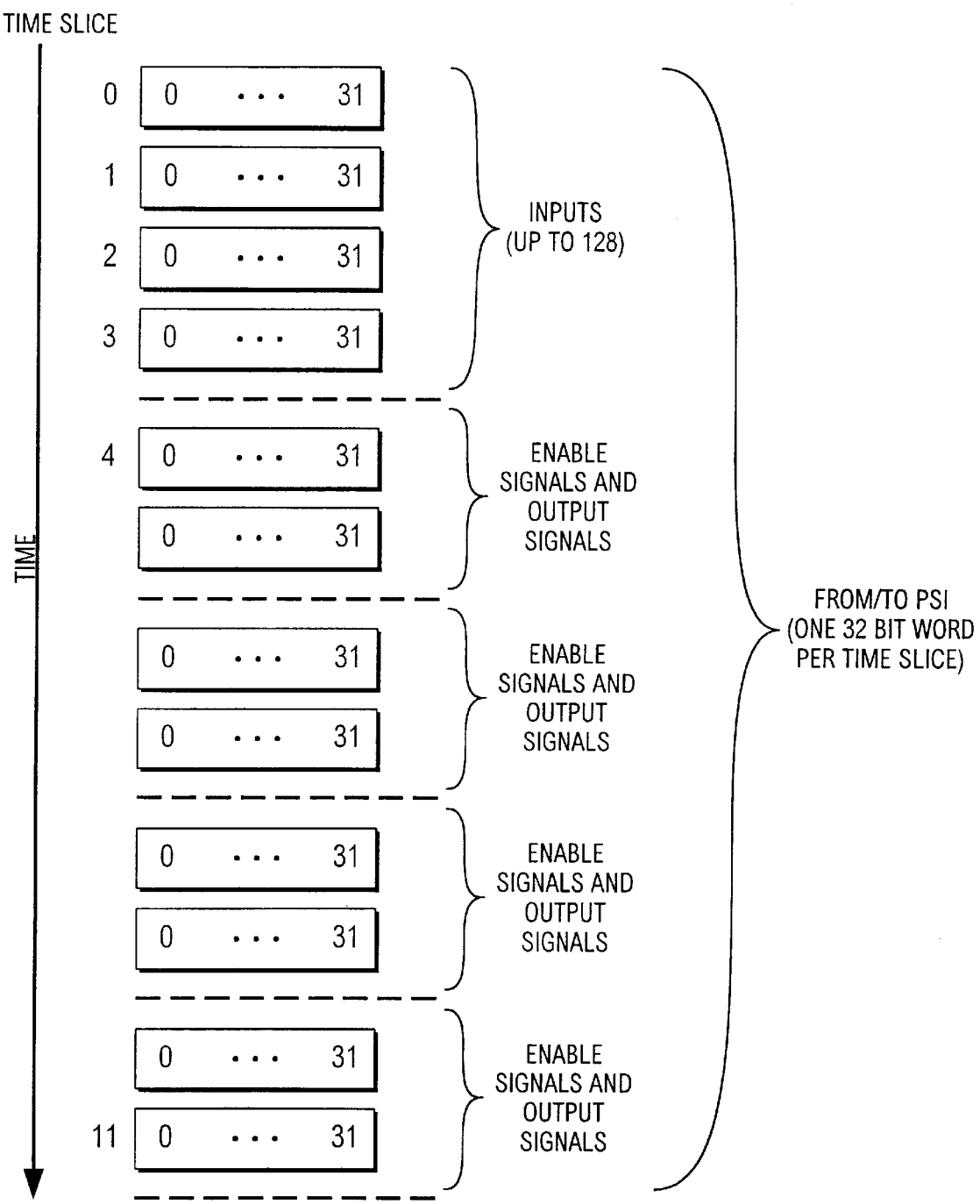
FIG. 10(a) shows an example timeline for data sent and received to and from a single PSI.

FIG. 10(a) shows an example timeline for data sent and received to and from a single PSI. During a first time slice, controller 302 sends 32 bits to a first PSI (and at the same time, sends 32 bits to each of the other N PSIs). The input signals are sampled from the target hardware by the PUI and transmitted to the controller 32 bits at a time during four different time intervals under control of the controller. After processing the inputs, the controller transmits enable and output data to the pod during eight different time intervals as shown in FIG. 10(a). Such multiplexing of input, output, and enable data reduces the wirecount of the target interface at least by a factor of 12 over conventional systems.

Figure 2:
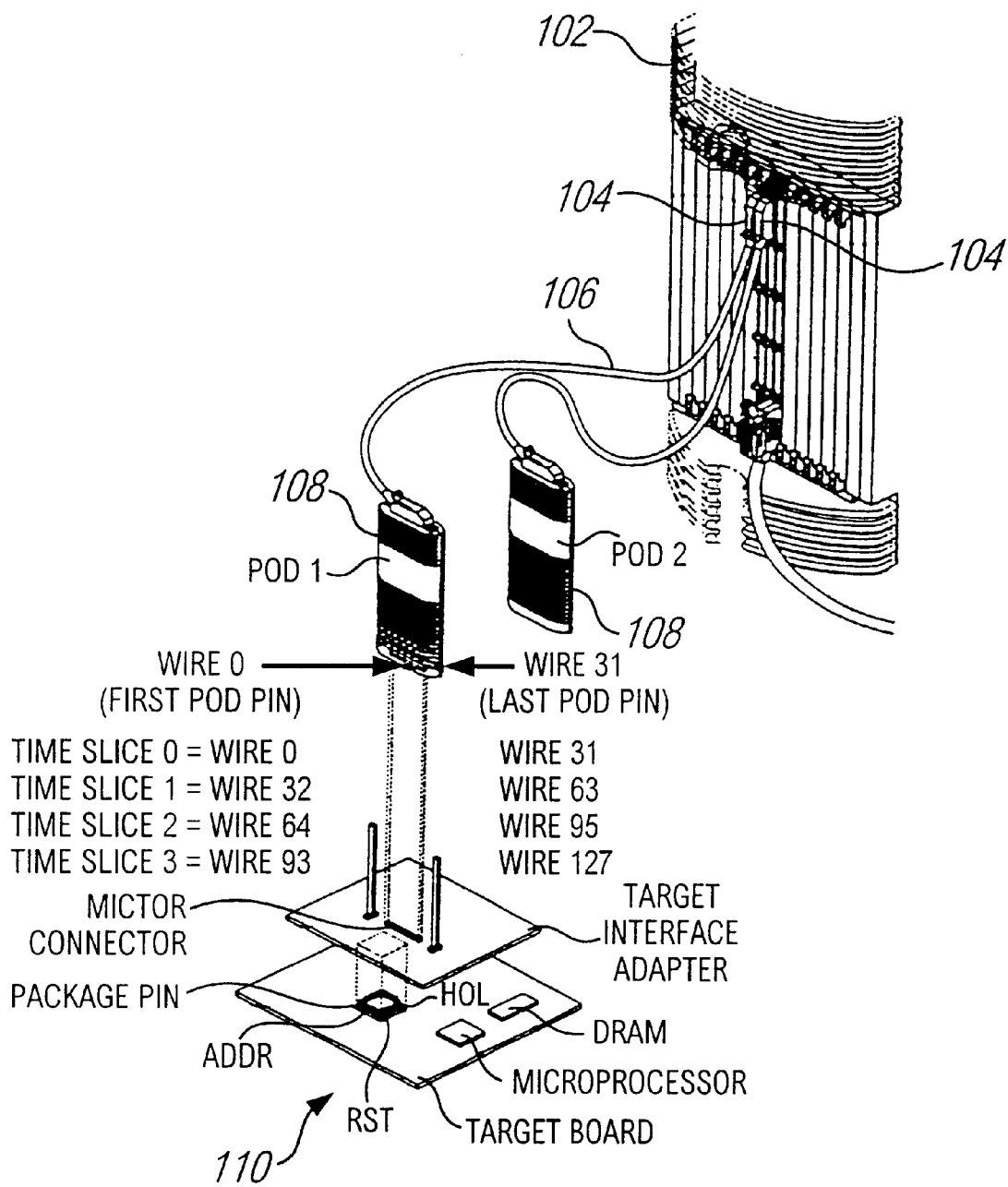
FIG. 2 shows an example of the system of FIG. 1, in which an emulator is connected to a target system through a Target Interface Backplane (TIB) and a plurality of Pod System Interconnect (PSI)/cable/ Pod User interface (PUI) combinations.

FIG. 2 shows an example of the system of FIG. 1, in which emulator 102 is connected to target system 110 through a plurality of PSI/cable/PUI combinations. In the system of FIG. 2, N=2. As indicated in the Figure, a 128 bit signal is divided into four 32 bit time slices for transmission over the PSI/cable/PUI combination between the emulator and the target system.

Figure 3A:
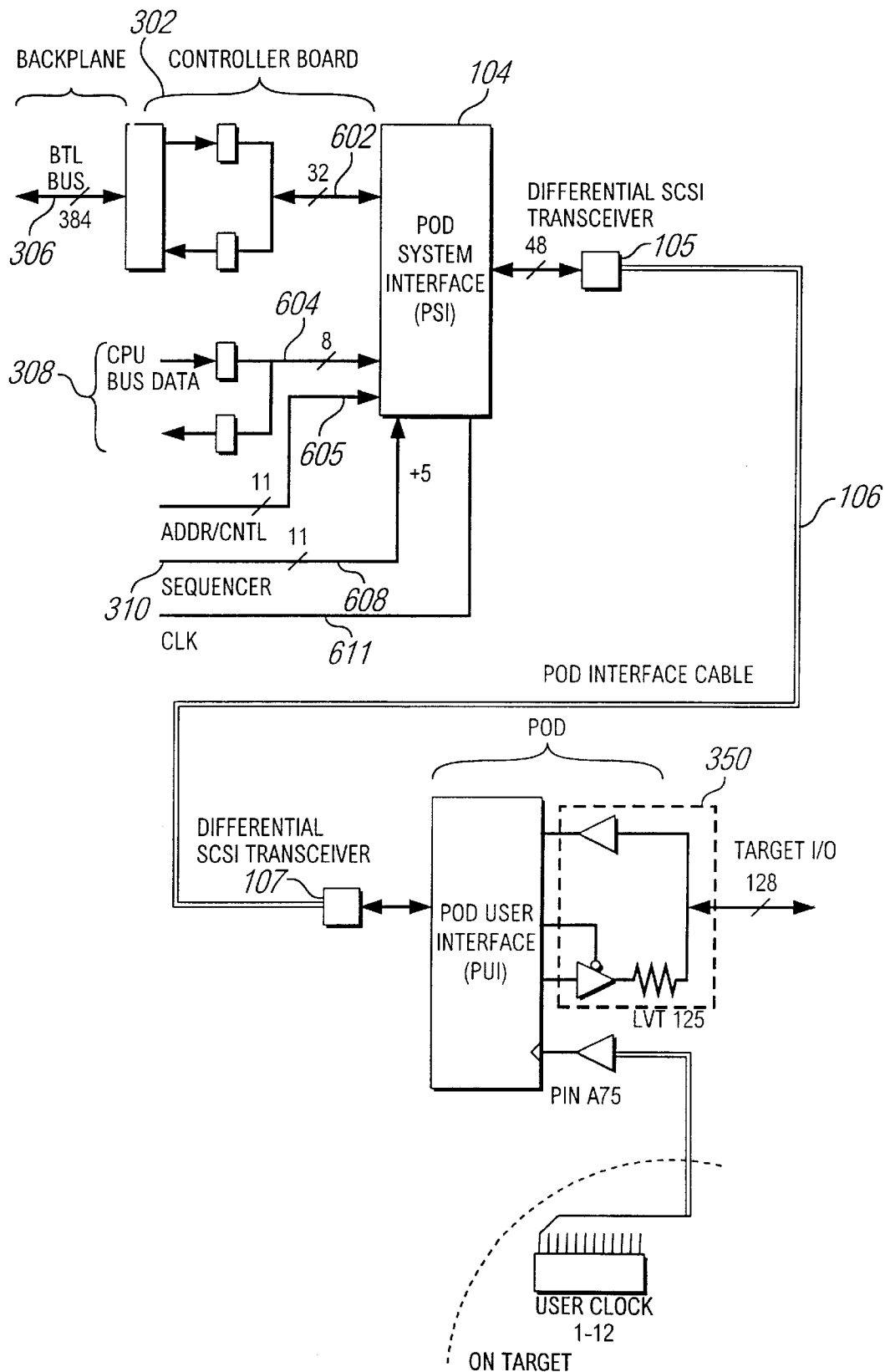
FIGS. 3(a) and 3(b) show additional detail of FIG. 2.

FIG. 3(a) shows additional detail of FIG. 2. A 384 bit BTL (Backplane Transceiver Logic) bus 306 couples emulator 102 to a controller board 302. In addition, the controller board and PSI are coupled by a CPU bus 308 and an 11 bit sequencer bus 310. Controller board 302 communicates with both PSI 104 and PUI 108 via these buses to effect multiplexing of input, output, and enable signals sent from and received by the emulator. FIG. 3(a) also shows differential SCSI transceiver 105 and 107, at either end of cable 106 and pin drivers 350, which connect each PUI to the target system 110. A preferred embodiment of the present invention uses differential signal drivers, specifically drivers that conform to the RS485 standard. This allows the target system to be at a different potential than the emulator and allows the emulator to be connected to a wider variety of target systems.

Figure 3B:
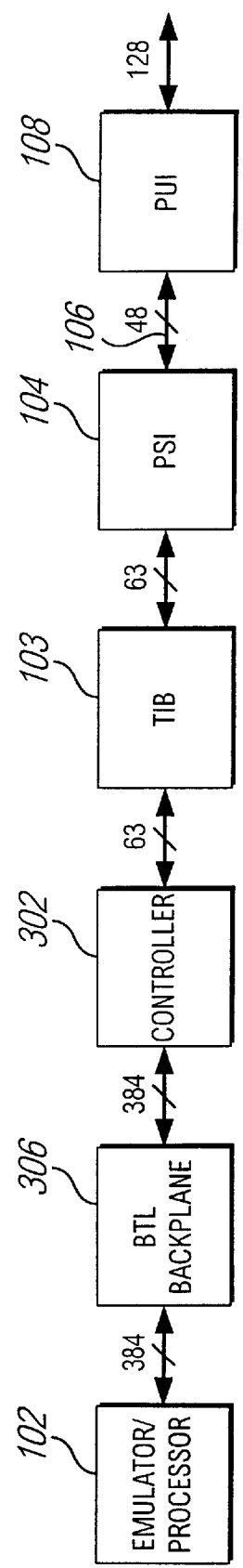
Figure 6B:
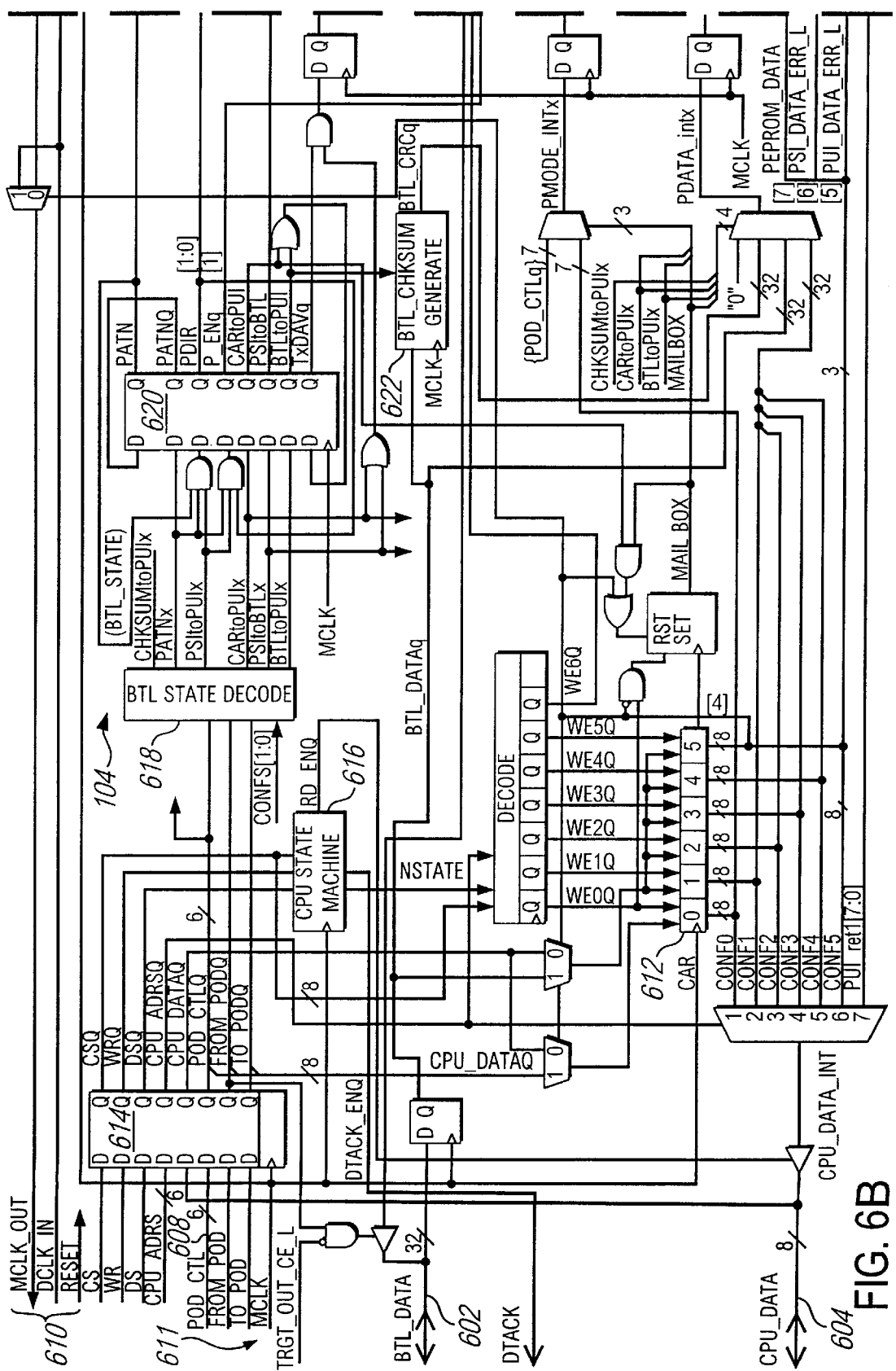
FIGS. 6(b) and 6(c) are an exemplary block diagram of a PSI of FIG. 1.
Figure 6C:
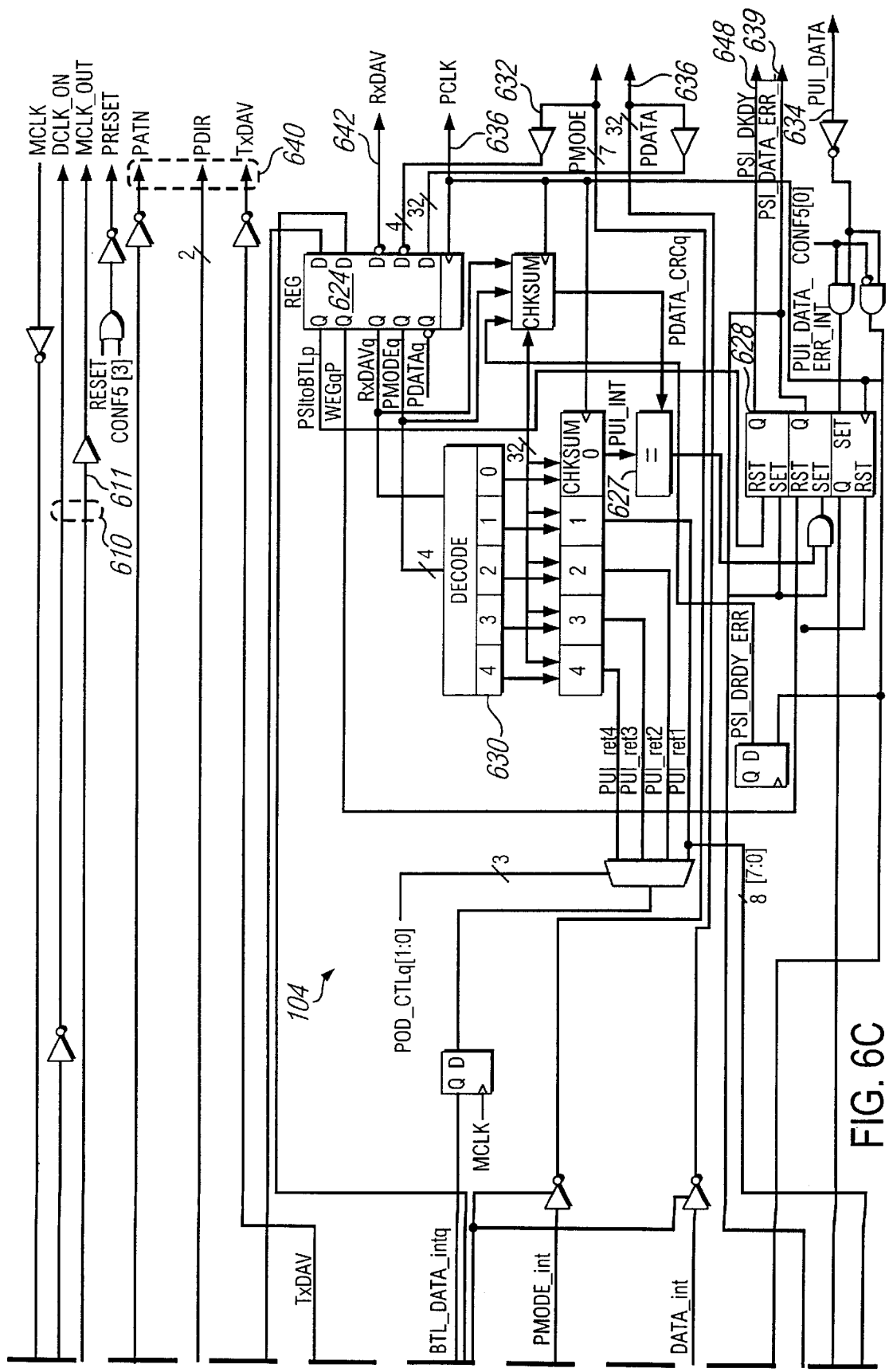
Figure 7:
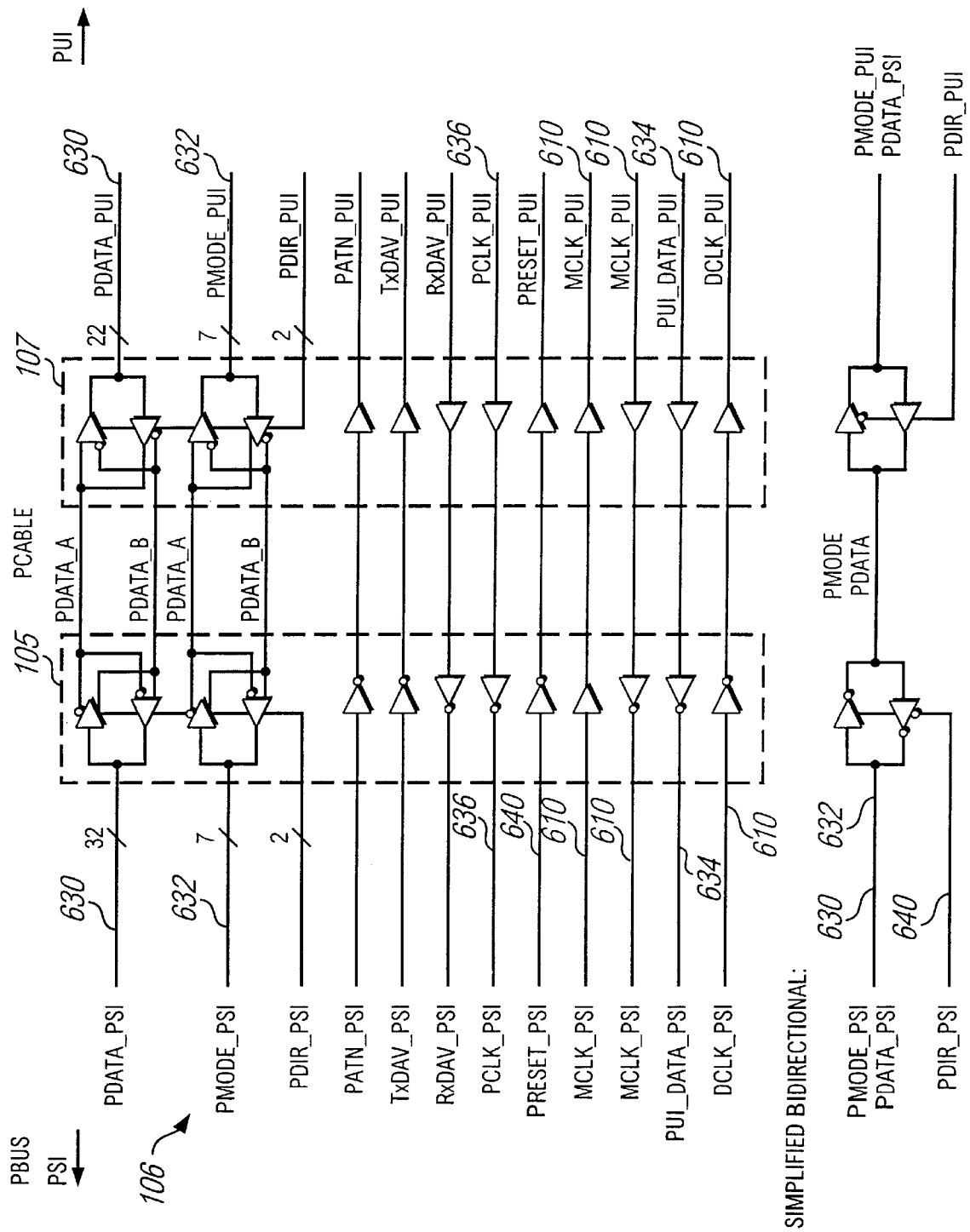
FIG. 7 is an exemplary block diagram of a cable connecting a PSI and a PUI.

FIG. 3(b) shows additional detail of FIG. 2. The 384 bit BTL bus connects eight processor boards in the emulator 102. BTL backplane 306 is coupled in turn to controller 302. Controller 302 outputs 63 bits of data and control lines to TIB 103 (32 bits of data 602, 8 bits of CPU data 604, 11 bits of address and control data 605, 11 bits of sequencer data 608, and a one bit clock signal 611, as shown in FIG. 3(a)). TIB 103 is coupled to twelve PSIs 104, which are coupled through twelve cables 106 to twelve PUIs 108. Details of a PSI are shown in FIGS. 6(b) and 6(c). Each cable 106 includes 32 data bits and 16 control bits as shown in FIG. 7. Each PUI contains 4 FPGAs, each implementing the circuitry of FIG. 8, so that each PUI outputs and receives a total of 128 (32×4) data bits to/from the target system.

Figure 4:
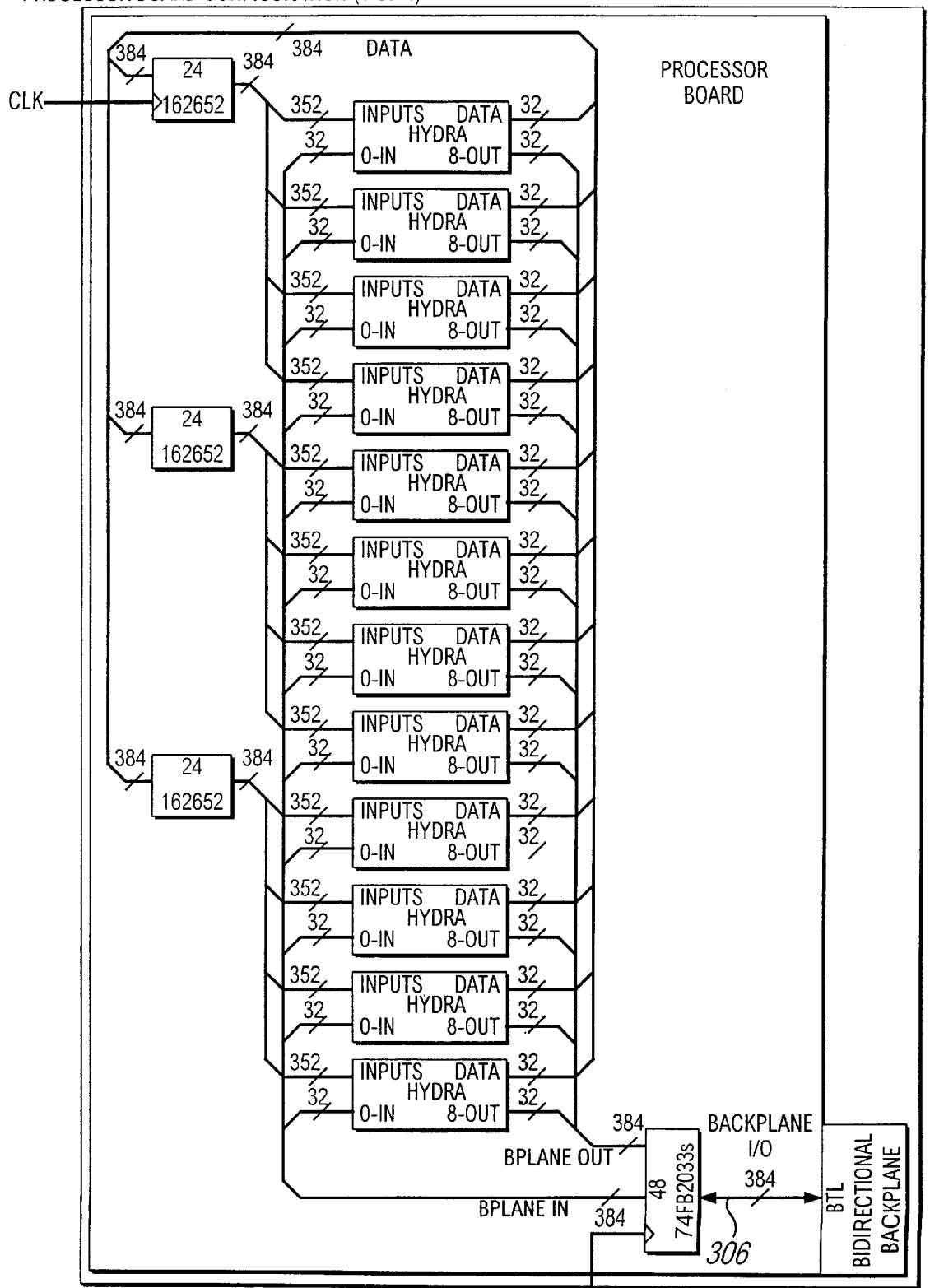
FIG. 4 shows a board level configuration of an emulator usable with the embodiment of FIG. 1 and including a bi-directional Backplane.

FIG. 4 shows a board level configuration of an emulator usable with the embodiment of FIG. 1 and including bi-directional BTL Backplane 306. The details of emulator 102 are described in the aforementioned U.S. application Ser. No. 08/496,239.

Figure 5:
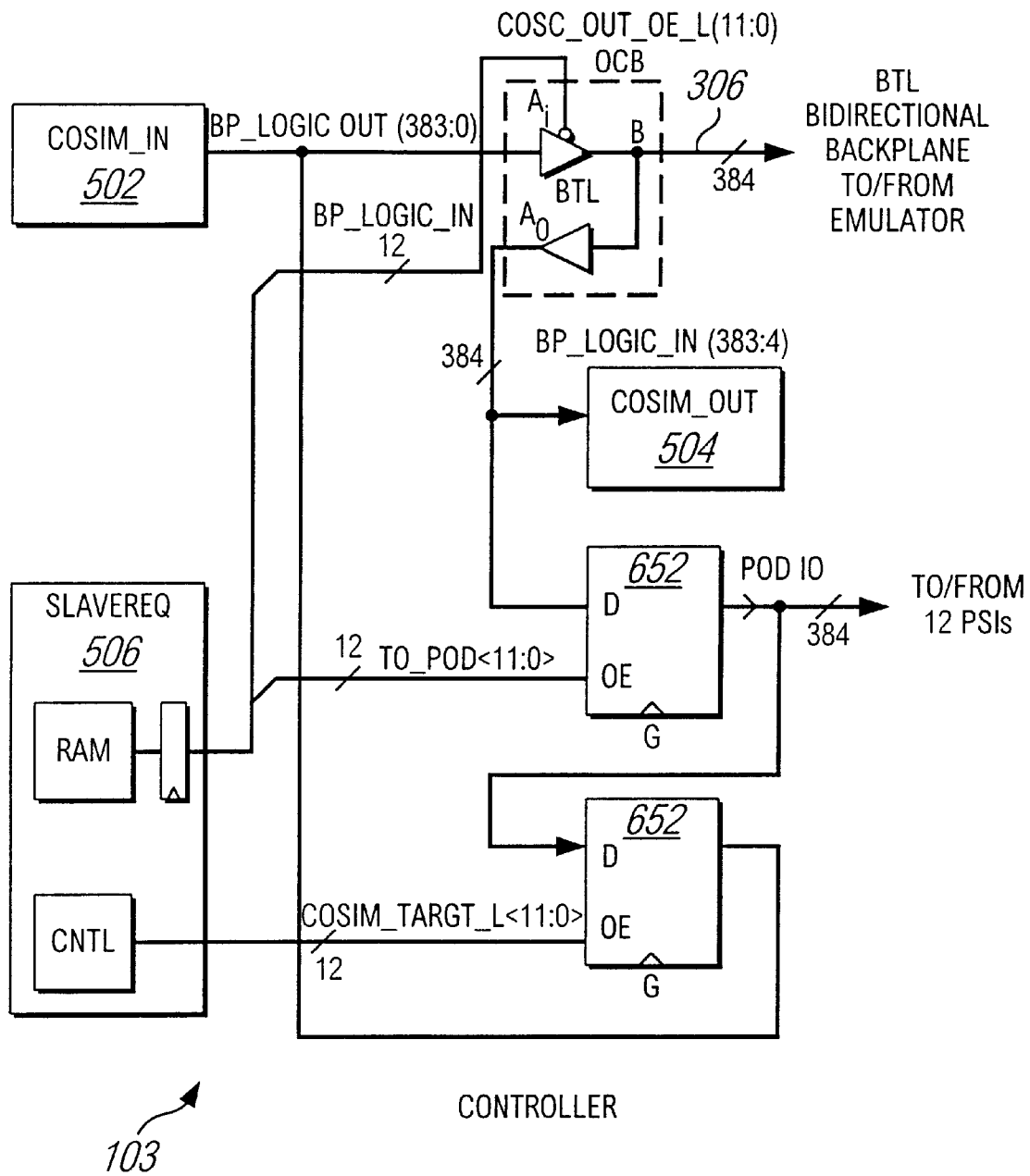
FIG. 5 shows a block diagram of the controller of FIG. 3.
Figure 9B:
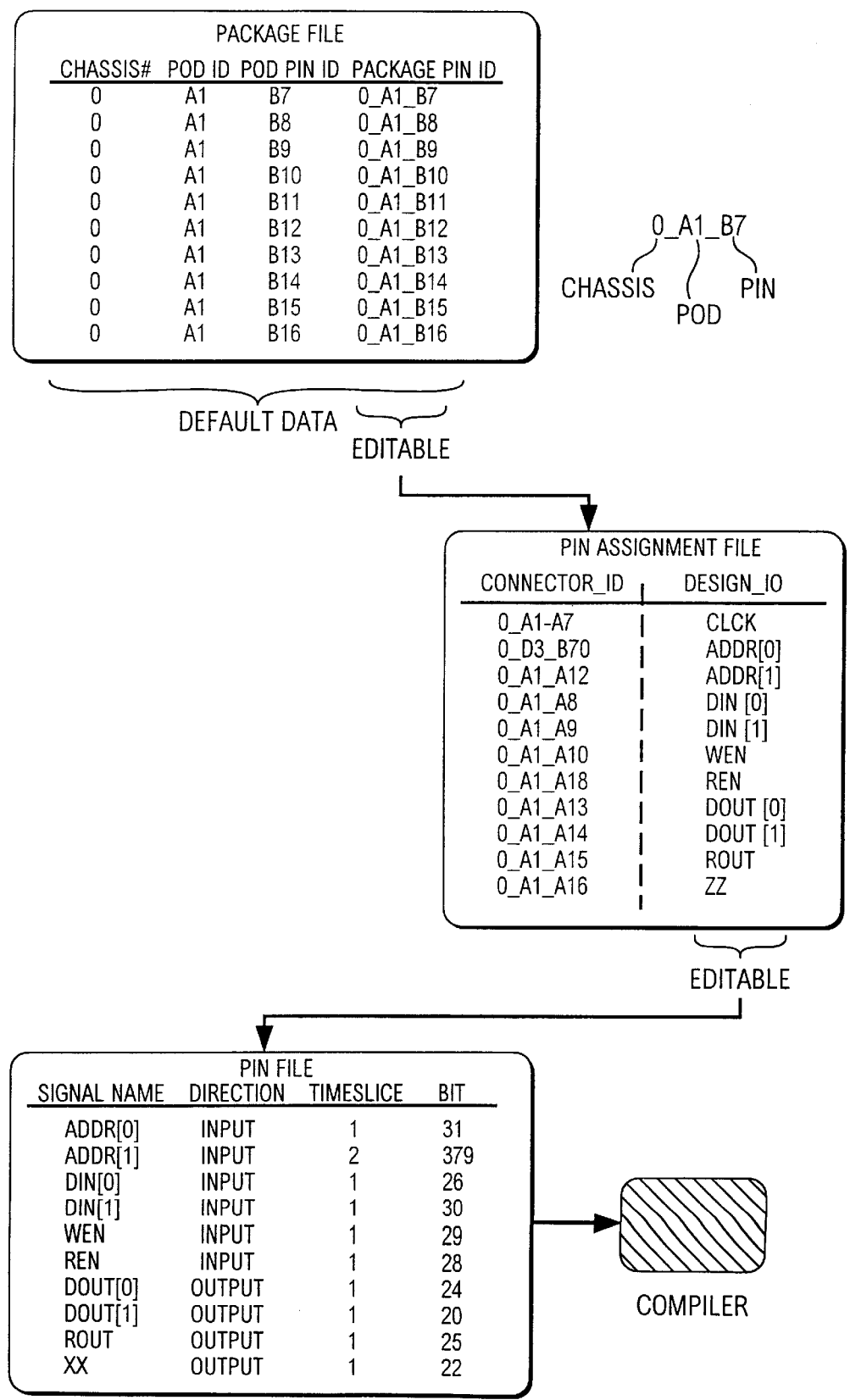
FIG. 9(b) shows an example of the relationships between different types of files describing pins.

FIG. 5 shows a block diagrams of the controller of FIG. 4. The emulator of the described embodiment runs in three different modes:

Synthesized test bench mode (in which the emulator runs in a self-contained state (i.e., not connected to a target system), C test bench mode (in which the test bench data is located on a workstation computer, such as a PC, connected to the emulator) and the emulator is connected to a target system), and In-circuit emulation (in which the emulator is connected to a target system). The below description relates mainly to the third mode—in circuit emulation. FIG. 5, however, shows controller 302 coupled to cosim_in module 502 and cosim_out module 504 (cosimulator_in and cosimulator_out) which interface to a workstation. As shown in FIG. 5, controller board 302 includes a slave sequencer 506, the operation of which is discussed below in connection with Table 1 below. In FIG. 5, a bi-directional 384 bit line 306 transfers data to/from emulator 102 and a 32 bit bi-directional line transfers data to/from a PSI. The emulator includes 1 sequencer on the controller and one on each processor board. The control words in slave sequencer 506 are determined at compile time, when a functional description (VHDL or Verilog) of the system to be emulated is compiled as described in U.S. application Ser. No. 08/496,239. This functional description includes a pin assignment file (PAF), which describes each input, output, and I/O pin of the target system. An example PAF is shown in FIG. 9(a). Use of a PAF file allows the user to assign I/O to any target pin they desire without regard to the type of pin (input, output, or tristate) and without regard to its location. FIG. 9(b) shows an example of the relationships between different types of files describing pins. Note that the PAF is used to generate a file in which various pins are assigned to a time slice.

Figure 18A:
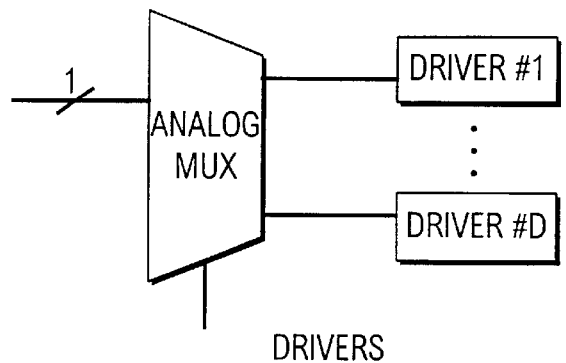
FIGS. 18(a) and (b) show circuits that allows the user to indicate a family of logic devices used by the target system.
Figure 18B:
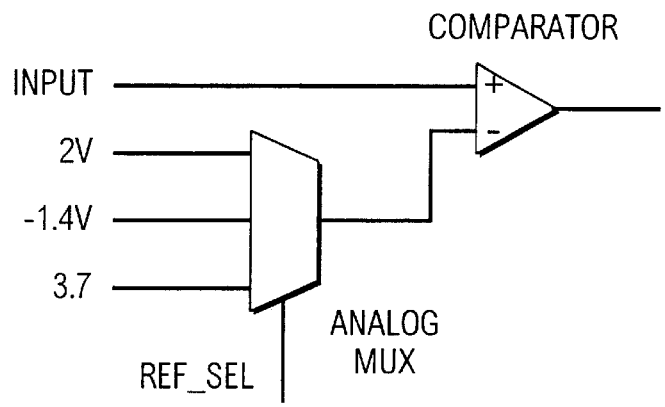

A preferred embodiment of the present invention also allows the user to indicate a family of logic devices used by the target system. FIG. 18 shows a circuit that allows the user to indicate a family of logic devices used by the target system. For example, the target system may use a family of 3.3 volt or 5 volt logic devices. In such an embodiment, drivers and receivers 350 of FIG. 3(a) would be replaced with analog MUXs and a plurality of drivers for each logic family, such as TTL, ECL, PECL, GTL, etc. The MUXs would select drivers/receivers on a bit by bit basis.

FIG. 6(a) shows the relationship between FIGS. 6(b) and 6(c). FIGS. 6(b) and 6(c) are an exemplary block diagram of PSI 104 of FIG. 1. Table II, discussed below, summarizes the input and output signals of a PSI. Signals to and from the controller of the emulator are designated in Table II as signals 1000. Bi-directional lines in FIG. 6(a) include: a 32 bit data line (BTL_DATA) 602 and an 8 bit line (CPU_DATA) 604. Control data from controller 302 includes a 6 bit POD-CTL line 608. Lines 602, 604, and 608 are also shown in FIG. 3. PSI 104 also includes clock lines 610, 611. As discussed below, clock signals can originate in the emulator or in the target system.

PSI 104 includes a CAR (Command Assembly Register) 612, which holds commands from controller 103, as described below. PSI 104 also includes registers 614, 620, and 624; BTL State Decoder 618; BTL Checksum generator 622, checksum module 626, reset flip flops 628, and data registers 630. FIG. 1 also includes various other components not discussed in detail herein, the function of which is known to persons of ordinary skill in the art.

PSI 104 also includes the following lines, which are coupled to cable 106: a 32 bit PDATA line 630, a 7 bit PMODE line 632, a 1 bit PUI_DATA line 634, a PCLK line 636, and a plurality of control lines (including PATN, TxDAV, and RxDAV).

FIG. 7 is an exemplary block diagram of a cable connecting a PSI and a PUI. As shown in FIG. 7, the cable connecting each of N PSIs and PUIs transmits 32 data bits (on PDATA line 630) and a plurality of control bits from controller 302. Table II, discussed below, summarizes the input and output signals of a PSI to a cable. Table II also summarizes the signals PDIR and DATA_ERR_L, which are designated in Table II as signals 1003. Signals of the PSI/cable interface are designated in Table I as signals 1002.

Figure 8:
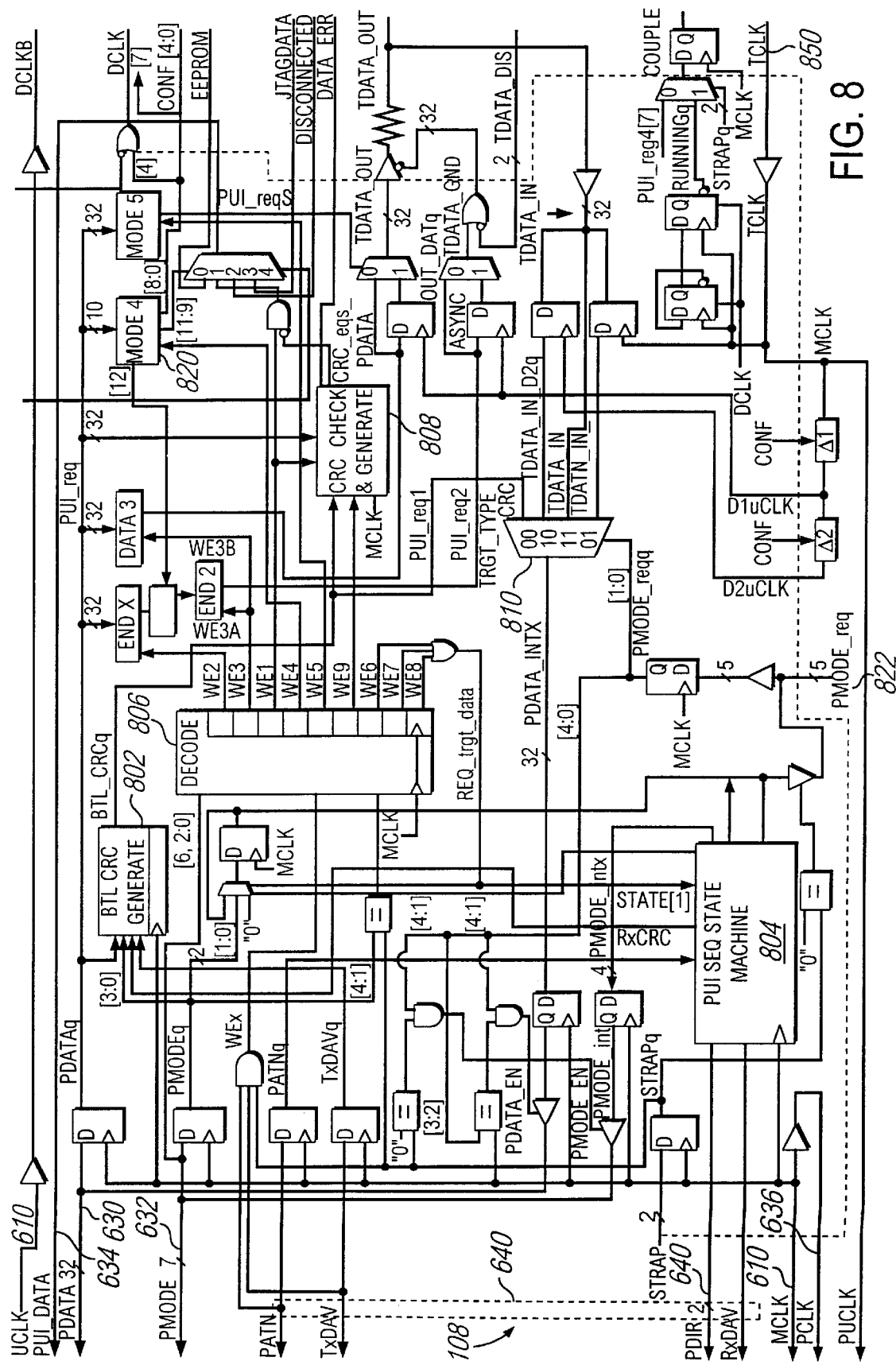
FIG. 8 is an exemplary block diagram of a PUI of FIG. 1.

FIG. 8 is an exemplary block diagram of a PUI of FIG. 1. The area inside dotted lines in the Figure represents one of the four FPGAs in each PUI. Elements of FIG. 8 include CRC generator 802, PUI sequence state machine 804, decoder 806, and target type selector 810. PSI 108 outputs and inputs 32 bits of data on bi-directional line TDATA 830. The I/O and control lines of FIGS. 6–8 are described in more detail in Appendices A and B. The operation of PSI 104 is further described in the attached Appendix A. The operation of PUI 108 is further described in the attached Appendix B.

Table 1 describes the interaction between controller 302 and each PSI/cable/PUI combination. A first portion of Table 1 describes control sequences sent by the slave sequencer on controller 302 to PSI 104, which in turn sends signals to PUI 108. A sequence mode depends on a 6 bit pod control signal 608, along with control signals TO_POD and FROM_POD, which is sent to the PSI and a 7 bit PMODE signal 632, which is sent from the PSI to the PUI, along with control signals PATN, TxDAV, and RxDAV. A second portion of Table 1 relates to addressing of data traveling from PUI 108 to PSI 104. As shown, each of the four FPGAs in the PUI is addressed separately. A third portion of Table 1 relates to a PUI configuration register 820 (see FIG. 8). A fourth portion of Table 1 relates to a PUI PMODE sequence register 822 (see FIG. 8)

Table II shows a summary of signals input to and output from PSI 104. Signals 100 represent signals from the controller to the PSI. Signals 1002 represent signals from the PSI to the cable. Two signals PDIR and DATA_ERR_L are represented by reference numeral 1003.

Figure 14:
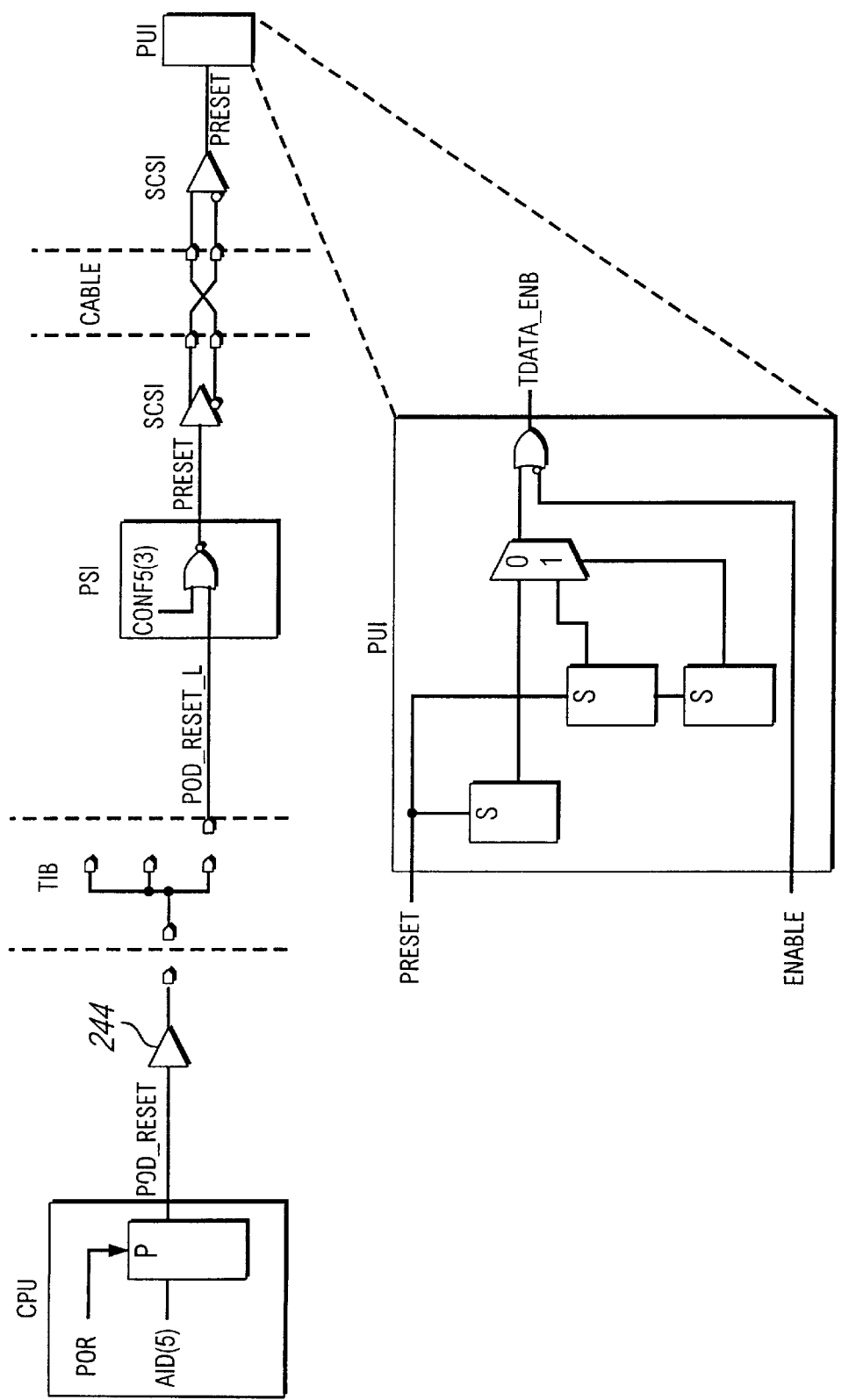
FIG. 14 is a block diagram showing a signal flow for a pod reset operation.

FIG. 14 is a block diagram showing a signal flow for a pod reset operation. Each of the signals of FIG. 14 can be seen in FIGS. 6–8. FIG. 14 is presented here for clarity of explanation.

b. Software Configurable Target Interface

1. Programmable I/O Assignment

As discussed above, the present invention allows the user to assign I/O functions to any target system pin they desire. Thus, the user can assign pins in such a way that the pins are not distributed sparsely in the groups of input, data, or enable pins) of the target system. In a preferred embodiment, the number of time slices required to send/receive input, output and enable signals are adjusted according to a minimum number required by the user-defined pin arrangement. In an alternate embodiment, the user does not assign pin locations, but allows the compiler to assign pin locations in a sequential manner.

2. Programmable DC Levels

As also described above, the present invention allows the user to specify a logic family for the target system (e.g., 3.3 volts or 5 volts). During emulation, hardware in the system selects the logic family indicated by the user. FIG. 18 shows an example of drivers and receivers in such an embodiment.

3. Programmable Pull-up or Pull-down

Figure 19:
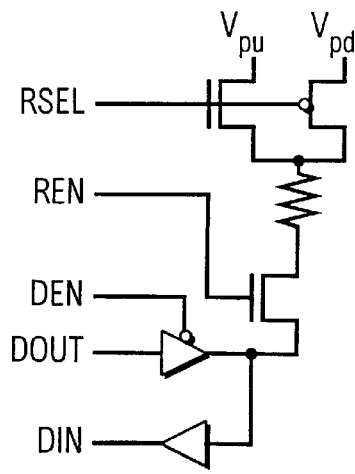
FIG. 19 shows a circuit that allows the user to implement programmable pull-up or pull-down internal resisters.

Some buses being emulated connect to busses and contain internal resistive devices that take the bus wires to a high or low logic level when all other devices on the bus are in a high impedance state. The present invention provides a software configurable way to selectable way to select either a pull-up or pull-down resistor on a per pin basis. This allows the emulation system to properly model tri-states or bidirects with resistive devices. FIG. 19 shows an example of a circuit that allows the user to implement programmable pull-up or pull-down internal resisters.

4. Programmable Force and Disable

Figure 11:
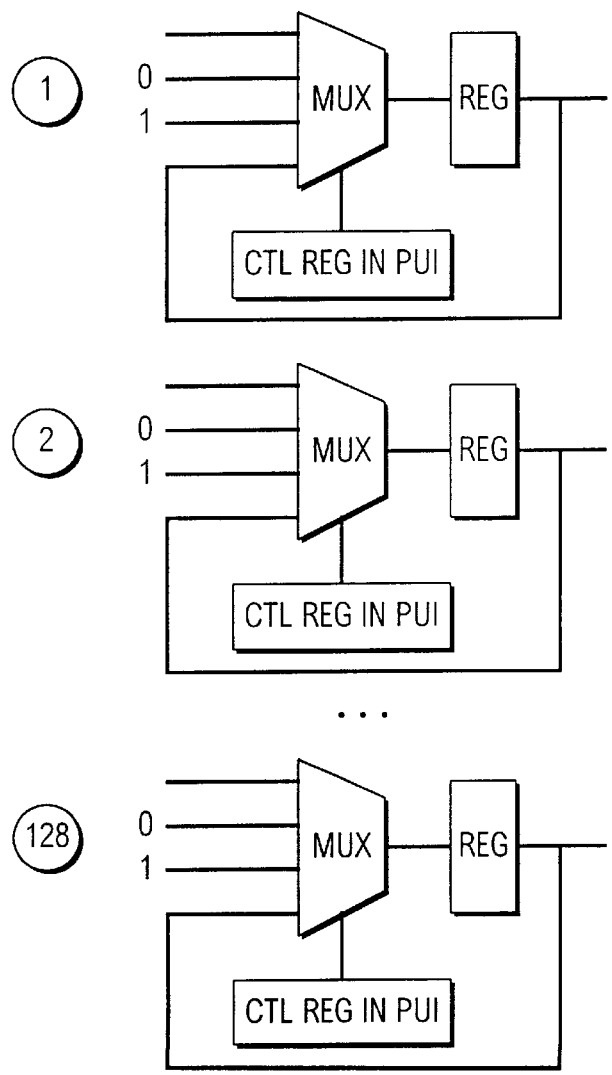
FIG. 11 shows a plurality of multiplexors used for forcing one or more bits of input data to desired values.

Sometimes, the system being emulated has a possibility of generating signals that might damage or interfere with the target system. The present invention provides a way of "forcing" target interface pins to a constant logic level (or placing them in a high impedance mode) during emulation. FIG. 11 shows an example of bit forcing. In a preferred embodiment, each 32 bits of data sent to the PSI is multiplexed as shown in the Figure. If the user has previously indicated (when the target pins are defined) that a particular pin should be forced to "1" or "0", the controller outputs the appropriate control bit to force that value for the bit. An alternate embodiment includes buffers so that the values can be changed on the fly under control of the emulator.

5. Programmable Pod Clocking

In some cases, users may require that the emulator generate clocking for the target hardware. In other cases, the user may desire that the clock be an input to the emulated design. In the early stages of design, the user may want to provide clocking to a static target environment (to allow single stepping). Later, when the design is more stable, the user might want to user the system clock from the target system. The present invention allows the user to indicate, under software control, whether to either drive the clock from the target hardware, or for the target hardware to receive a clock signal from the emulator. FIG. 6(*a*) shows a clock signal (dclck) generated by a slave sequencer on the controller. This signal is always sent to the target system. FIG. 8 shows a target system clock (Tclk) 850 provided from the target system. The Tclk signal is either generated by the target system (in which case, the target system is supplying the clock signal) or it is based on the dclk signal (in which case the emulator is supplying the clock signal).

Figure 15:
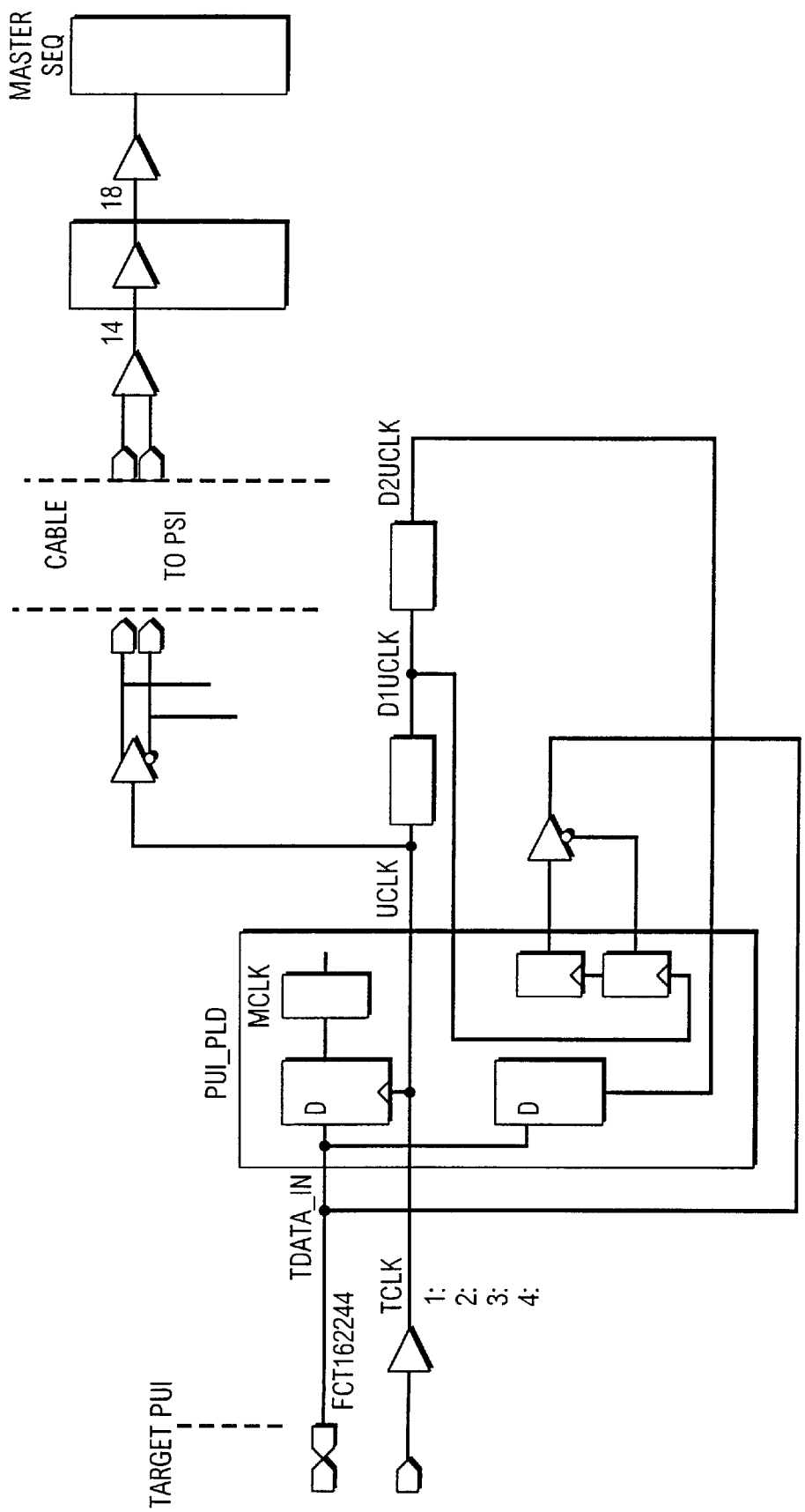
FIG. 15 is a block diagram showing a signal flow when a dock signal is generated in the target system and how the clock signal is routed back to the master sequencer in the emulator.
Figure 16:
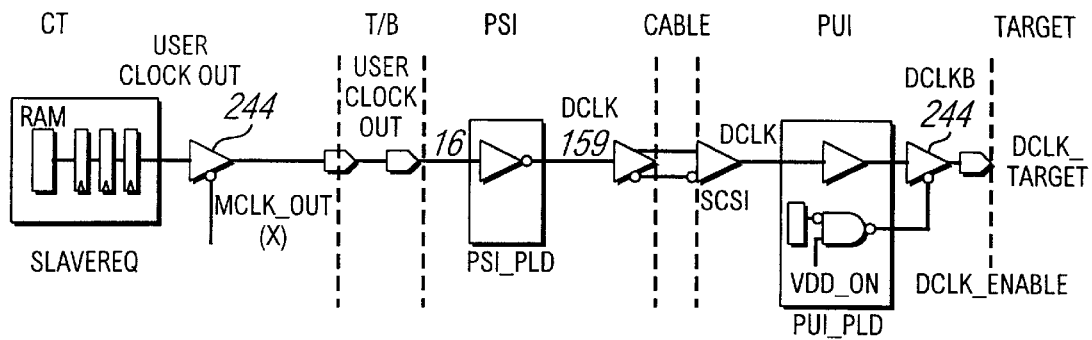
FIG. 16 is a block diagram showing a signal flow when a clock signal is generated in a slave sequencer in the emulator.
Figure 17:
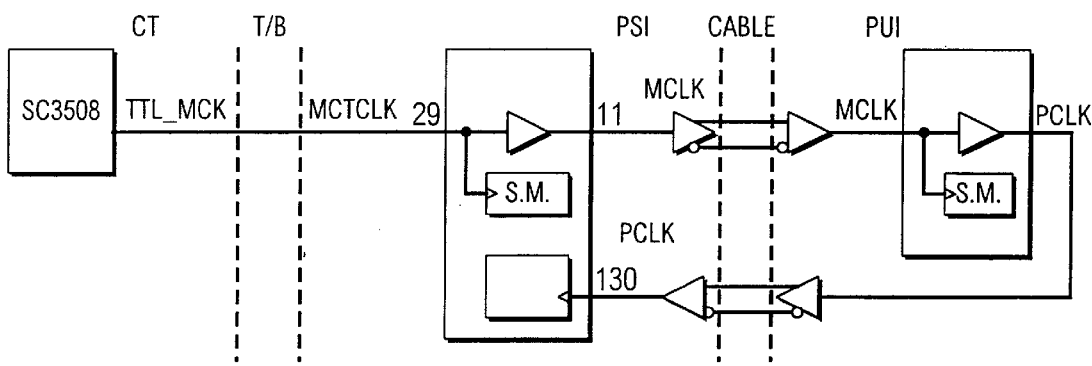
FIG. 17 is a block diagram showing a signal flow of a system clock.

The following FIGS. 15–18 are presented for clarity of explanation and show simplified versions of various clock signals in the described embodiment. FIG. 15 is a block diagram showing a signal flow when a clock signal (tlck) is generated in the target system and routed back to a master sequencer in the controller of the emulator. FIG. 16 is a block diagram showing a signal flow when a clock signal (dclk) is generated in a slave sequencer in the controller of the emulator and sent to the target system. FIG. 17 is a block diagram showing a signal flow of a system clock (mclk/pclk).

6. Programmable Sampling Modes

The target system can provide inputs to the emulated design which come from registered outputs or registered outputs followed by combinational logic. In sampled data systems (such as emulator 102), it is necessary to treat these inputs differently in order to be able to process the design in only one emulation program cycle.

The present invention can select, on a per pin basis, one of three different sampling modes for each pin. Inputs to the emulated design that come from register outputs (synchronous) are sampled with the clocking event of the highest frequency clock in the system. Inputs to the design that come from registered outputs followed by combinational logic (asynchronous) are sampled a programmable delay after the clocking event of the highest frequency clock in the system. The third sampling mode allows time for the combinational logic to evaluate before the inputs are sampled and processed by the emulator.

c. Performance Tuning the Target.

Certain preferred embodiments of the present invention contain features that enhance the performance of the emulation system. These embodiments provide improved performance in the basic multiplexing concept described above, but add additional hardware, so may or may not be appropriate for a particular circumstance.

1. Pipelining With Logic Processing

In a time sliced emulation system, the values of sequential and combinational logic need to be computed by the emulator in order to model the user design. These elements of the design are scheduled by the compiler, based on the constraints of the system resources and the input and output dependencies associated with each of the elements. In order to reduce the impact of the overhead incurred by time-multiplexing the target interface signals, a "late input scheduling" method attempts to schedule elements of the design that do not depend on primary inputs to the design in parallel with the sampling and transmission of those primary inputs to the emulation system from the pod hardware.

Figure 12A:
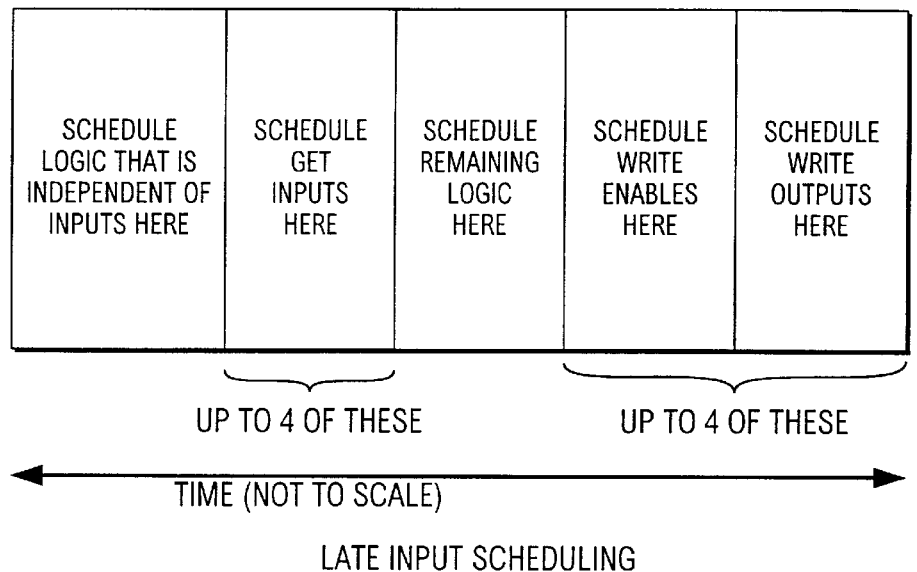
FIG. 12(a) is a timeline showing an example of scheduling inputs, enables and outputs in a time efficient manner.

FIG. 12(a) shows an example of how "late input scheduling" would occur if some logic was independent of inputs and some was not. In the Figure, logic that is independent of inputs is scheduled to be performed first. Thus, logic dependent on inputs is performed second, after the inputs are available from the target system.

Likewise, using an "early output scheduling" method, elements whose results are not needed as primary enables and outputs of the design are scheduled in parallel with the transmission of those primary enables and outputs from the emulator 102 to the pod hardware. Ideally, there are enough elements that are not critically dependent on the target I/O to allow full use of the processing resources of the system simultaneously with the receive and transmit I/O operations.

Figure 12B:
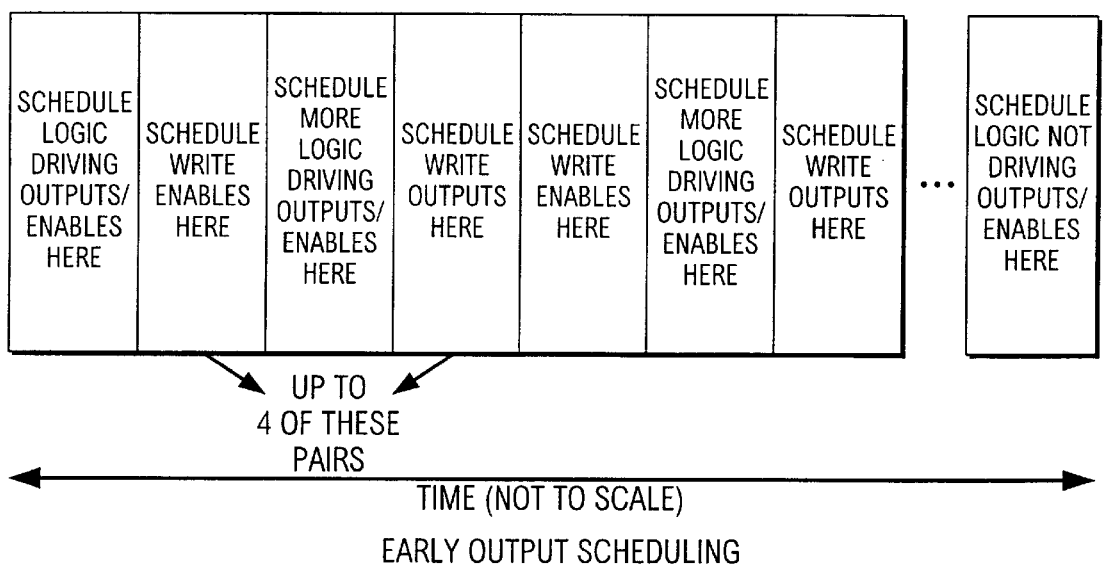
FIG. 12(b) is a timeline showing an example of scheduling inputs, enables and outputs in a time efficient manner.

FIG. 12(b) shows an example of how "early output scheduling" would occur if some logic was independent of outputs and enables and some was not. In the Figure, logic that is driving outputs/enables is scheduled to be performed before those outputs/enables. Thus, logic not driving outputs/enables is performed after the outputs/enables are sent to the target system.

2. Performance Driven Data Reordering

Figure 10B:
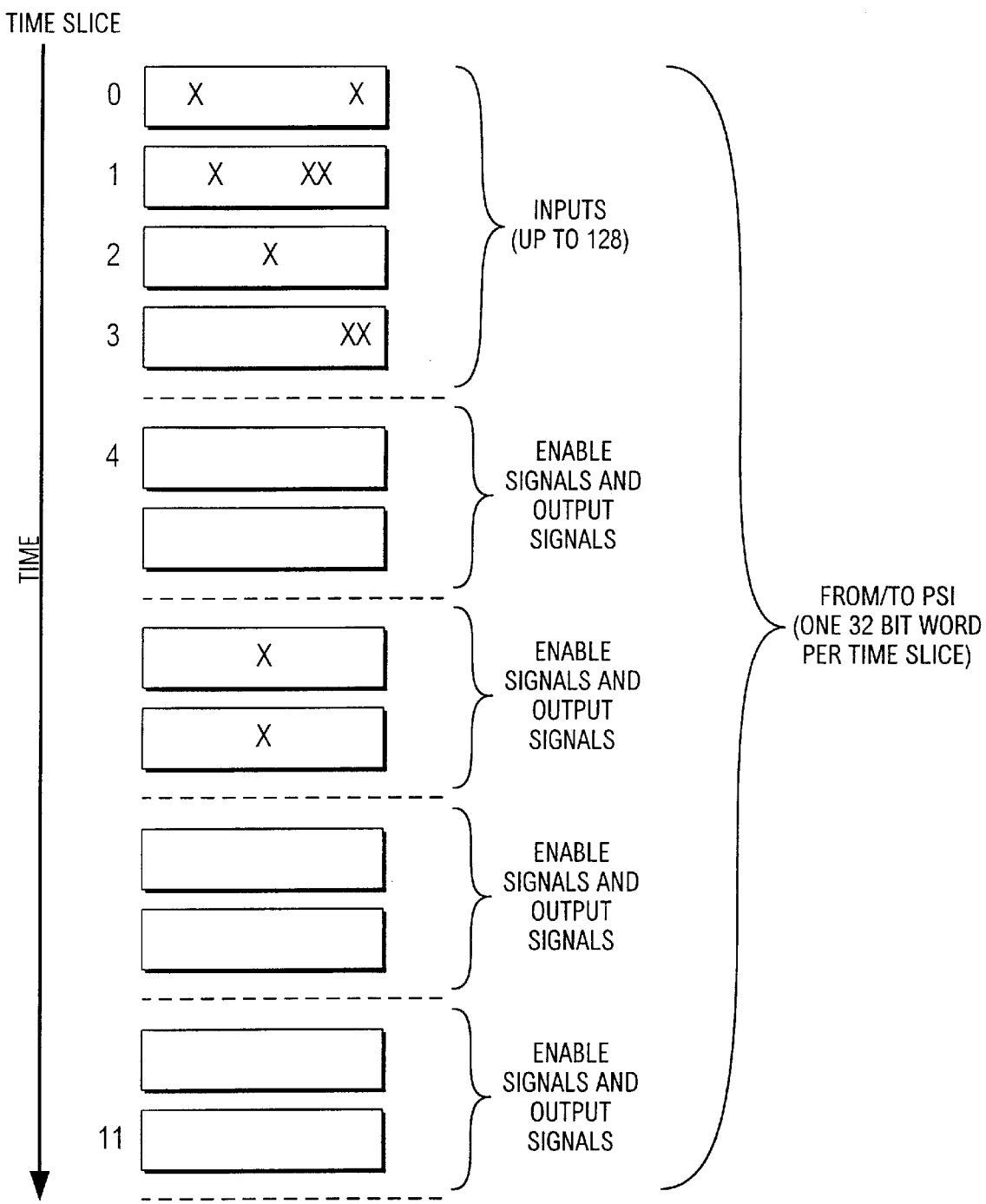
FIG. 10(b) shows an example of data sparsely distributed in the time slices of FIG. 10(a).

A preferred embodiment of the present invention changes the order in which data is sent to and received from the PSI. Since the average design being emulated contains a mix of input, output, tristate, and bi-directional pins, there are many unused portions of the time multiplexed data space. The described embodiment reorders the input, output and enable data from the order shown in FIG. 10(a) to a more efficient ordering. This method of reordering optimizes the performance of the target interface by packing the data into as few time slices as possible. The reordering method is performed by having routing and storage hardware built in to the interface hardware FIG. 10(b) shows an example of data sparsely distributed in the time slices of FIG. 10(a). As shown in the Figure, there are many unused portions of the time-multiplexed data space. Data is represented by "X"s.

Figure 10C:
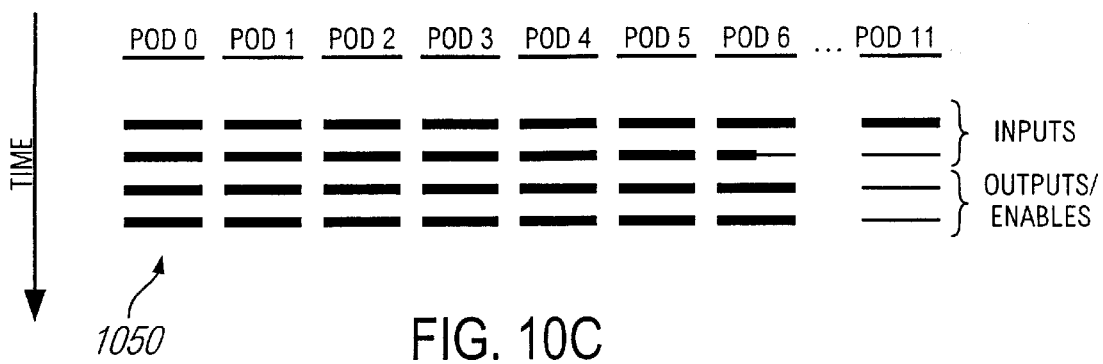
FIG. 10(c) shows the example of FIG. 10(c), where the data that has been reordered.

FIG. 10(c) shows the example of FIG. 10(c), where the data that has been re-ordered ("packed") in accordance with the described embodiment. FIG. 10(c) shows data sent to and from the emulator via 12 pods over time. As discussed above, other embodiments may have a different number of pods. Data is shown by heavy lines. Reference numeral 1050 indicates a 32 bit wide data space. Because the input and output signals are "packed" into contiguous portions of the data space, fewer time slices are required to interface to the target system.

3. Wave Pipelining

A preferred embodiment of the present invention uses low skew drivers to drive the data and clock signals on the connection between the controller target board and the pod connector. Thus, it is not necessary to wait until the current set of data is clocked into the receiver hardware before sending the next set or sets of data over the connection. Using the delays inherent in the cable to separate multiple data transmissions makes it possible to separate multiple data transmissions and increase the overall throughput of the communication channel.

d. Improving Reliability

1. Metastable Immune Sampling Devices

In some target environments, the primary input signals to the emulated design arrive asynchronously. To the clock with which they are being sampled. A preferred embodiment of the preferred invention uses metastable immune parts, such as the Philips 74F50729 or 74F50109 to sample the primary input data at the target interface. Use of metastable parts reduces the probability of errors caused by metastability to effectively zero.

2. Automatic Data Checking

Even the most carefully constructed cabling and connectors can break and cause intermittent failures. Because users of emulation depend on the system as a debugging tool, they must be informed of any hardware failures at the earliest possible time in order to avoid wasting time debugging a good design when the problem originates in bad hardware emulation.

A preferred embodiment of the present invention transmits data to and from the controller 302/target system 110 and the PSI/PUI during known intervals. This fact allows the transmitting portion of the interface to compute error checking information, such as checksum, CRC (cyclic redundancy error) or parity for each block of data and sends it along with the sampled data to the receiving hardware. The receiving hardware then compares the error checking information with the data it receives to insure that the data is correct. This method allows any problems to be detected and reported to the user.

FIG. 6((b) includes a checksum module 626, which computes a checksum for each 32 bit word of data received from the PUI. This computed checksum is compared with a checksum sent from the PUI with the data by element 627. Element 808 of FIG. 8 performs a similar function for data received by the PUI.

3. Automatic Conflict Detection

Many emulated designs contain bi-directional or tristate pins that are connected to a target hardware environment 110. In most cases, the purpose of these pins is so that, at some time during the operation of the circuit, the target environment will be driving data on the wires connected to those types of pins. Because the emulator is a debugging and verification tool that is sometimes used on incomplete or non-functional (i.e., non-tested) designs, the enables generated by the emulated design for these pins may be incorrect and could be enabled at the same time as drivers in the target circuitry. The target hardware needs to be protected from damage caused by driver conflicts.

A preferred embodiment of the present invention is placed between the driving device in the emulator and an input buffer connected to a physical pad that is connected to the target hardware. The voltage levels at each of these points, along with the driver current is monitored by the target interface. Whenever the emulator is driving the pin and the voltage level at the driver does not match the voltage level at the pad, within some predetermined margin, such as 20%, a driver conflict is flagged. Immediately after detecting such a condition, the driver in the emulator is turned off to prevent damage to the target circuitry.

Figure 13:
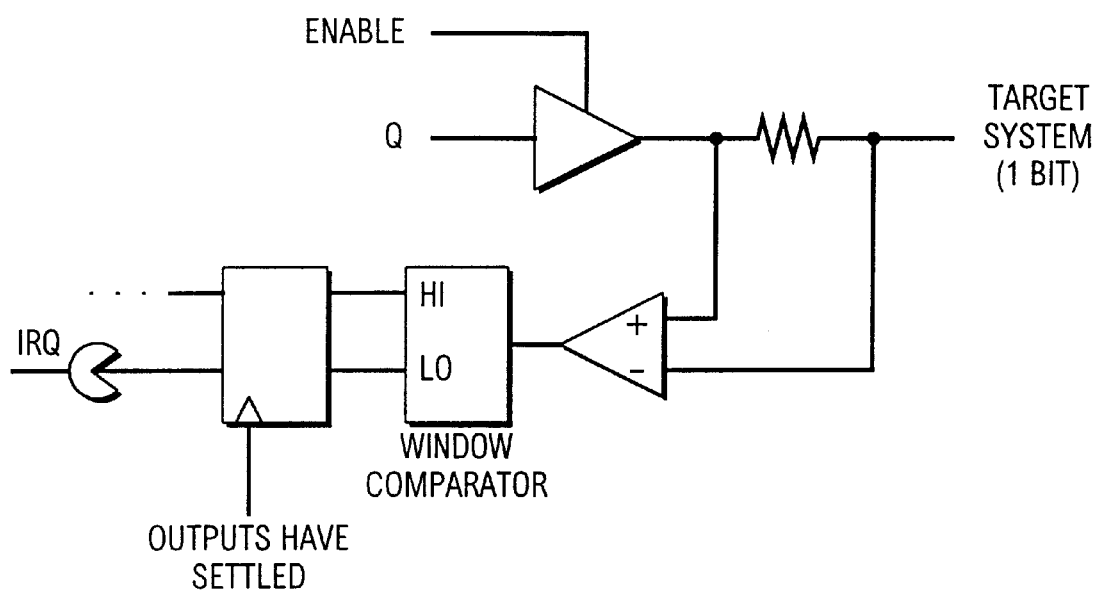
FIG. 13 shows an example of a circuit that performs automatic conflict detection for a single bit received from the target system.

FIG. 13 shows an example of a circuit that performs this function for a single bit received from the target system 110. If the voltage of a received bit exceed a predetermined value by a predetermined amount, an interrupt is issued to the emulator.

e. Summary

A preferred embodiment of the present invention incorporates a plurality of Pod System interfaces (PSIs), each of which plugs into a backplane of the emulator. Each PSI is connected via a specially designed cable to a Pod User Interface (PUI). Each PUI is, in turn, connected to an interface of the target system. Various embodiments of the present invention implement features in a time-sliced hardware-based emulator. These features include programmable I/O assignment; programmable levels of DC voltage; programmable pull-up or pull-down resistors in the emulator on a pin-by pin basis; programmable forcing and/or disabling of value output from the emulator on each pin; programmable clocking; and programmable sample modes.

Other embodiments will be apparent to those skilled in the art from consideration of the specification and practice of the invention disclosed herein. It is intended that the specification and examples be considered as exemplary only, with a true scope of the invention being indicated by the following claims.

What is claimed is:

1. A target I/O system for coupling an emulator having a plurality of data bits to a target system, comprising:

a plurality of PSI modules coupled to the emulator, each PSI module sending input bits to the emulator and receiving output bits and output enable bits from the emulator in a predetermined order;

a cable coupled to each of the PSI modules; and a plurality of PUI modules, each of the PUI modules connected to a respective one of the PSI modules through a respective cable, and further coupled to the target system to transmit the input, output and output enable bits to and from target system in the predetermined order, wherein the output bits and the enable bits are sent from the emulator during different times slices.

2. The target I/O system for coupling an emulator having a plurality of data bits to a target system, comprising:

a plurality of PSI modules coupled to the emulator, each PSI module sending input bits to the emulator and receiving output bits and output enable bits from the emulator in a predetermined order;

a cable coupled to each of the PSI modules; and a plurality of PUI modules, each of the PUI modules connected to a respective one of the PSI modules through a respective cable, and further coupled to the target system to transmit the input, output and output enable bits to and from the target system in the predetermined order, wherein the output bits and the input bits are sent to and from the emulator, respectively, during different time slices.

3. The target I/O system for coupling an emulator having a plurality of data bits to a target system, comprising:

a plurality of PSI modules coupled to the emulator, each PSI module sending input bits to the emulator and receiving output bits and output enable bits from the emulator in a predetermined order;

a cable coupled to each of the PSI modules; and a plurality of PUI modules, each of the PUI modules connected to a respective one of the PSI modules through a respective cable, and further coupled to the target system to transmit the input, output enable bits to and from the target system in the predetermined order, wherein there are twelve PSIs and twelve PUIs.

4. The target I/O system for coupling an emulator having a plurality of data bits to a target system, comprising:

a plurality of PSI modules coupled to the emulator, each PSI module sending input bits to the emulator and receiving output bits and output enable bits from the emulator in a predetermined order;

a cable coupled to each of the PSI modules; and a plurality of PUI modules, each of the PUI modules connected to a respective one of the PSI modules through a respective cable, and further coupled to the target system to transmit the input, output and output enable bits to and from the target system in the predetermined order, wherein there are eleven PSIs and eleven PUIs.

5. A target I/O system for coupling an emulator having a plurality of data bits to a target system, comprising:

a plurality of PSI modules coupled to the emulator, each PSI module sending input bits to the emulator and receiving output bits and output enable bits from the emulator in a predetermined order;

a cable coupled to each of the PSI modules; and a plurality of PUI modules, each of the PUI modules connected to a respective one of the PSI modules through a respective cable, and further coupled to the target system to transmit the input, output and output enable bits to and from the target system in the predetermined order, wherein the input, output and enable bits are sent during four time slices.

* * * * *